(12) United States Patent
Kim et al.

(10) Patent No.: US 9,851,388 B2
(45) Date of Patent: Dec. 26, 2017

(54) APPARATUS AND METHOD FOR DETECTING FAULTS OF BATTERY HEATING SYSTEM AND RELAYS

(71) Applicant: Hyundai Motor Company, Seoul (KR)

(72) Inventors: Beom Gyu Kim, Hwaseong (KR); Mi Ok Kim, Seongnam (KR); Jong Hu Yoon, Hwaseong (KR)

(73) Assignee: Hyundai Motor Company, Seoul (KR)

( * ) Notice: Subject to any disclaimer, the term of this patent is extended or adjusted under 35 U.S.C. 154(b) by 461 days.

(21) Appl. No.: 14/569,712

(22) Filed: Dec. 14, 2014

(65) Prior Publication Data

US 2015/0323603 A1    Nov. 12, 2015

(30) Foreign Application Priority Data

May 9, 2014 (KR) .................. 10-2014-0055266

(51) Int. Cl.
*H01M 10/48* (2006.01)
*H01M 10/615* (2014.01)
(Continued)

(52) U.S. Cl.
CPC .......... *G01R 31/02* (2013.01); *G01R 31/327* (2013.01); *G01R 31/3278* (2013.01); *H01M 10/48* (2013.01); *H01M 10/615* (2015.04); *H01M 10/625* (2015.04); *H01M 10/6571* (2015.04); *H02J 7/0016* (2013.01); *H02J 7/0021* (2013.01); *H02J 7/0063* (2013.01); *H02J 2007/0067* (2013.01)

(58) Field of Classification Search
CPC .... G01R 31/02–31/07; G01R 31/3278; H01M 6/5038; H01M 8/04037; H01M 8/04268; H01M 10/60–10/667; H01M 2010/4271
See application file for complete search history.

(56) References Cited

U.S. PATENT DOCUMENTS 5,991,509 A     11/1999 Goto et al.
7,573,150 B2 *   8/2009 Hirasawa ............. B60L 3/0046
                                                    307/132 EA
(Continued)

FOREIGN PATENT DOCUMENTS

JP              4572168 B2    10/2010
KR     10-2001-0059059 A      7/2001
(Continued)

*Primary Examiner* — Eric Ward
(74) *Attorney, Agent, or Firm* — Mintz Levin Cohn Ferris Glovsky and Popeo, P.C.; Peter F. Corless

(57) ABSTRACT

Disclosed is a method and system for detecting faults of a battery heating system and relays. In particular, a method for detecting welding of each relay such as a main relay, a precharge relay or a heater relay and a method for detecting a fault of a battery heating system such as a short circuit, disconnection or damage of each heater are provided by sensing a voltage. In the methods, the on/off state of the heater relay and the high voltage relays is controlled through a predetermined process to detect a fault of the heater relay or the high voltage relay, and welding of the heater relay or the high voltage relay is then detected from a voltage for fault detection which is sensed through a voltage sensing circuit unit for fault detection.

18 Claims, 6 Drawing Sheets

(51) Int. Cl.
*G01R 31/02* (2006.01)
*G01R 31/327* (2006.01)
*H01M 10/625* (2014.01)
*H01M 10/6571* (2014.01)
*H02J 7/00* (2006.01)

(56) References Cited

U.S. PATENT DOCUMENTS

| | | | | |
|---|---|---|---|---|
| 8,085,515 | B2* | 12/2011 | Yugou | H01H 47/002 |
| | | | | 361/23 |
| 8,618,813 | B2* | 12/2013 | Ishii | H02H 3/162 |
| | | | | 324/541 |
| 8,983,314 | B2* | 3/2015 | Atarashi | G03G 15/205 |
| | | | | 399/37 |
| 9,048,660 | B2* | 6/2015 | Yoon | B60L 3/00 |
| 2013/0257440 | A1* | 10/2013 | Takahashi | G01R 31/327 |
| | | | | 324/418 |
| 2015/0064591 | A1* | 3/2015 | Haltiner, Jr. | E21B 43/2401 |
| | | | | 429/435 |

FOREIGN PATENT DOCUMENTS

| | | |
|---|---|---|
| KR | 10-2004-0017628 A | 2/2004 |
| KR | 10-0829307 B1 | 5/2008 |
| KR | 10-2011-0040063 A | 4/2011 |
| KR | 10-2011-0130277 A | 12/2011 |
| KR | 10-2011-0139424 A | 12/2011 |
| KR | 10-2014-0007080 A | 1/2014 |

\* cited by examiner

APPARATUS AND METHOD FOR DETECTING FAULTS OF BATTERY HEATING SYSTEM AND RELAYS

CROSS-REFERENCE TO RELATED APPLICATION

This application claims under 35 U.S.C. §119(a) the benefit of Korean Patent Application No. 10-2014-0055266 filed on May 9, 2014, the entire contents of which are incorporated herein by reference.

TECHNICAL FIELD

The present invention relates to a method for detecting faults of a battery heating system and relays. In particular, the present invention provides the method for detecting welding of each relay such as a main relay, a precharge relay, or a heater relay and the method for detecting a fault of a battery heating system, such as a short circuit, disconnection or damage of each heater by simply sensing a voltage.

BACKGROUND

An environmentally friendly vehicle such as an electric car, a hybrid car, and a fuel cell car promotes reduction in exhaust gas and improvement of fuel efficiency by using a motor as a driving source for driving a vehicle. In particular, a high voltage battery that is a power source for operating the motor is connected to the motor to be chargeable/dischargeable through an inverter. The high voltage battery of the environmentally friendly vehicle may have a battery pack structure in which a plurality of battery cells are disposed as one group to form a module and a plurality of battery modules are connected in series, to store and providing high-output and high-capacity electric energy.

Meanwhile, when the temperature of a battery module decreases in a cold weather condition, chargeable/dischargeable power may be reduced, and therefore, the efficiency of a battery system deteriorates. Accordingly, the temperature of a battery may be required to be increased to an optimal temperature or greater.

The capacity and output performance of the high voltage battery may deteriorate at substantially low temperatures or in the cold weather condition. Particularly, when the high voltage battery is used as a main power source in the electric vehicle, the electric vehicle may be substantially sensitive to the temperature of the battery, more so than the hybrid vehicle. Therefore, a battery heating system for raising the temperature of the battery within a reduced amount of time to increase the capacity and output of the battery at a vehicle start time may be required for the environmentally friendly vehicle. In addition, a battery heating system for raising the temperature of the battery to an optimal temperature may be required to charge the environmentally friendly vehicle in a reduced amount of time.

As an example of the related art for raising the temperature of the battery, a method for controlling heating of a high voltage battery has been developed. The method increases the temperature of battery modules using a balancing resistor. In addition, a heating apparatus of a battery module has been developed in the related art, and the apparatus may include a heater member having a heating wire to a side of a battery module.

For example, FIG. 1 illustrates a battery heating system in the related art. As shown in FIG. 1, a pad-type resistance heater such as a PTC planar heater 12 is installed to increase temperature in each battery module 11 constituting a battery pack 10. In particular, the resistance heaters 12 of the battery modules 11 are connected in series to be connected to the battery pack 10 through a heater relay 25. As such, as the on/off state of the heater relay 25 is controlled, the on/off state of all the resistance heaters 12 may be collectively controlled.

For example, the resistance heaters 12 are operated by receiving power supplied from the battery pack 10. Accordingly, when the heater relay 25 is switched to be the on state by a control signal of a battery management system (BMS) 30, all the resistance heaters 12 generate heat together as the power of the battery pack 10 is simultaneously supplied to the resistance heaters 12 of the battery modules 11, thereby simultaneously increasing the temperature of all the battery modules 11.

Particularly, the BMS 30 collects battery state information including the voltage current, temperature, state of charge (SOC) and the like of the battery pack 10, and directly uses the collected battery state information in charging/discharging control or provides the collected battery state information to other controllers inside/outside a vehicle to be used in vehicle control and the like.

In addition, a power relay assembly (PRA) 20 includes a plurality of high voltage relays for selectively opening/closing (+) and (−) power lines connected to the battery pack 10. The on/off state of each high voltage relay is controlled by the BMS 30. In particular, the PRA 20 includes two high voltage main relays that are main power contact points, i.e., a main relay ((+) main relay) 21 of the (+) power line and a main relay ((−) main relay) 22 of the (−) power line, and a precharge relay 23 and a precharge resistor 24, which are disposed on a circuit bypassing the main relay 21 of the (+) power line.

Meanwhile, the high voltage relays 21, 22, 23 and 25 described above may have a problem of welding, and hence an algorithm for determining the welding of these relays may be applied. When welding occurs in the relay, high voltage may be exposed to the exterior even in an IG-OFF state such as a parking state, and thus, a dangerous situation such as an electric shock may occur. The welding of the relay refers to a state in which two contact points are adhered by an arc generated between the contact points such that the on/off state of the relay may not be controlled. When the off state of the relays 21, 22, 23 and 25 is not possible due to the contact point welding, direct current (DC) high voltage may be exposed to the exterior, and thus, a dangerous situation such as an electric shock of a human body may occur. Accordingly, welding of high voltage relays including the heater relay 25 and the like in required to be checked as well as the main relays 21 and 22 of the (+) and (−) power lines and the precharge relay 23.

In the related art, a separate sensing circuit configured to sense voltage for each battery cell or battery module has been used to check welding. For example, the BMS 30 detects welding of the main relays 21 and 22, the precharge relay 23 and the like from the voltage sensed in the state in which the on/off state of each relay is controlled. A fault or failure of the battery heating system such as welding of the heater relay 25, is detected from a temperature of the battery module 11 or the resistance heater 12, sensed after the main relays 21 and 22 are on. Particularly, a temperature sensor configured to detect a temperature of the resistance heater is used as shown in FIG. 2.

For example, when the temperature of the resistance heater which is sensed by the temperature sensor increases in a state in which the off state of the heater relay 25 is controlled after the main relays 21 and 22 are on, the heater relay is determined to be in a welding state. In addition, whether temperature increases from a temperature of the battery module 11 or the resistance heater 12 which is measured by an individual temperature sensor is determined to detect a fault of the battery heating system such as a disconnection or short circuit of the resistance heater.

For example, when a variation in temperature between the battery modules 11 or a variation in temperature between the heaters is substantial in a state in which the temperature of the battery module 11 increases to an extent after the heater relay 25 is the on state, the heater is determined to be short circuited. When the temperature of a specific battery module 11 or the temperature of a specific heater does not increase even when the heater relay 25 is a on state, the corresponding resistance heater 12 is determined to be disconnected or a heating wired is disconnected.

However, in the related art, a temperature sensor is required for each battery module 11 or the resistance heater 12 separately from the voltage sensing circuit for detecting welding of the relay (FIG. 2) in order to detect a fault of the battery heating system. Moreover, when a fault of the battery heating system is detected by identifying a variation in temperature between the battery modules in the state in which the temperature of the battery module is raised to an extent, such as detection of a short circuit of the heater, or by identifying an increase in temperature after the heater relay is the on state, such as detection of a disconnection of the heater, time to identify a variation in temperature or an increase in temperature may increase.

Accordingly, misdiagnosis may occur due to an environment such as external air or a system characteristic. For example, a variation in temperature may occur due to the influence of a flow path and the like during the operation of a fan and an increase in temperature may occur due to the use of a battery. Hence, the clear decision with respect to a faulty part may not be possible due to the environment and the system characteristic.

The above information disclosed in this section is merely for enhancement of understanding of the background of the disclosure and therefore it may contain information that does not form the prior art that is already known in this country to a person of ordinary skill in the art.

SUMMARY

The present invention provides a method of detecting welding of each relay such as a main relay, a precharge relay or a heater relay. In addition, the present invention provides a method of detecting a fault of a battery heating system, such as a short circuit, disconnection or damage of each heater. In particular, the methods of the present invention may be obtained by sensing a voltage instead of sensing a temperature of an individual battery module or heater or an individual battery cell.

In one aspect, the present invention provides an apparatus for detecting faults of a heater relay and high voltage relays in a battery heating system which may include a heater installed in each battery module of a battery pack to heat the battery module, the heater relay configured to selectively apply power to the heaters connected in series, and the high voltage relays of (+) and (−) power lines connected to the battery pack. The apparatus may include: a voltage sensing circuit unit for fault detection which senses a voltage for fault detection when the faults of the heater relay and the high voltage relays are detected; and a battery management system (BMS) configured to control the on/off state of the heater relay and the high voltage relays. In particular, the BMS may be configured to detect welding of the heater relay and the high voltage relays from the voltage for fault detection which may be sensed by the voltage sensing circuit unit for fault detection.

In another aspect, the present invention provides a method for detecting faults of a heater relay and high voltage relays in a battery heating system which may include a heater installed in each battery module of a battery pack to heat the battery module, the heater relay configured to selectively apply power to the heaters connected in series, and the high voltage relays of (+) and (−) power lines connected to the battery pack. The method may include: controlling the on/off state of the heater relay and the high voltage relays through a predetermined process such that a fault of the heater relay or the high voltage relay may be detected; and detecting welding of the heater relay or the high voltage relay from a voltage for fault detection which may be sensed through a voltage sensing circuit unit for fault detection.

According to various exemplary embodiments of the present invention, welding of each relay such as the main relay, the precharge relay or the heater relay may be detected, and a fault of the battery heating system and a type of the fault such as short circuit, disconnection or damage of the heater and a position of the fault such as front or rear end based on a voltage sensing point may be determined by sensing a voltage, instead of sensing a temperature of an individual battery module or heater or an individual battery cell.

BRIEF DESCRIPTION OF THE DRAWINGS

The above and other features of the present invention will now be described in detail with reference to various exemplary embodiments thereof illustrated the accompanying drawings which are given hereinbelow by way of illustration only, and thus are not limitative of the present invention, and wherein.

Figure 1:
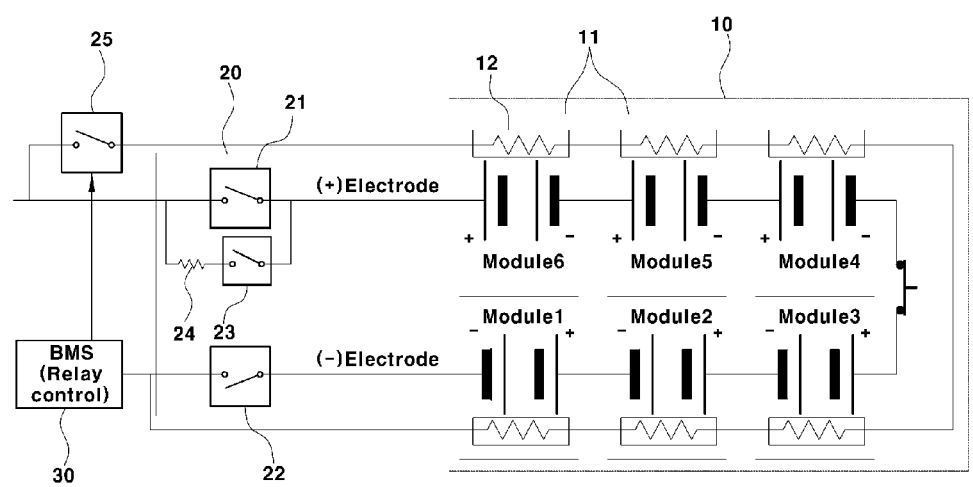
FIG. 1 illustrates a battery heating system in the related art.
Figure 2:
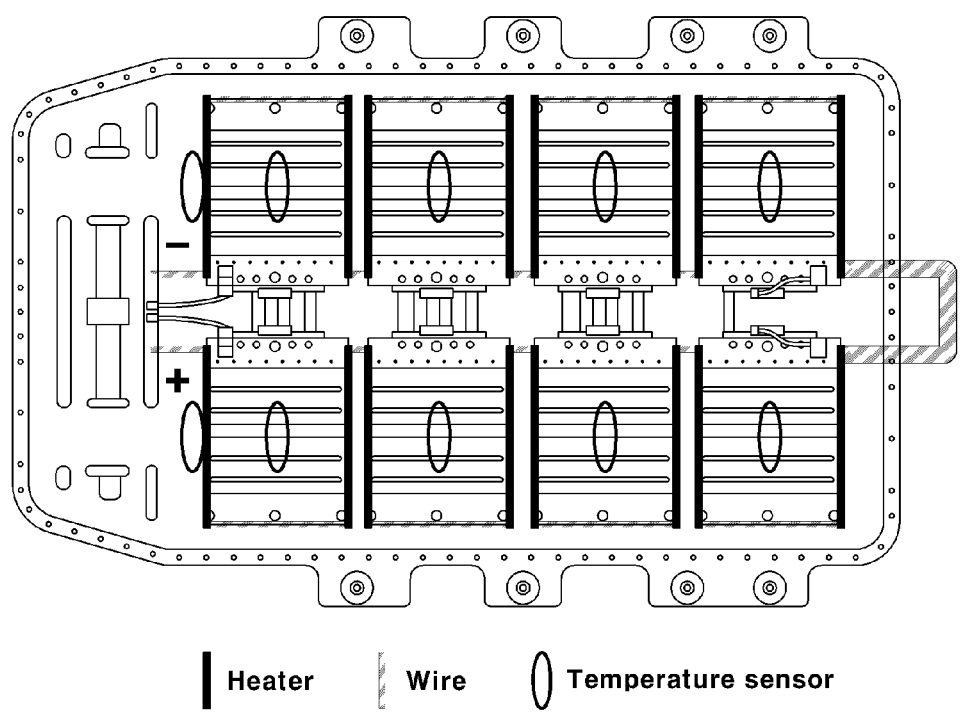
FIG. 2 illustrates a temperature sensor mounted in a battery pack in the related art.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment. In the figures, reference numbers refer to the same or equivalent parts of the present invention throughout the several figures of the drawing.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about".

Although exemplary embodiment is described as using a plurality of units to perform the exemplary process, it is understood that the exemplary processes may also be performed by one or plurality of modules. Additionally, it is understood that the term controller refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

Hereinafter reference will now be made in detail to various exemplary embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

The present invention provides a method of detecting welding of each relay. The detected welding of each relay may be, but not limited to, a main relay, a precharge relay or a heater relay. The present invention also provides a method of detecting a fault of a battery heating system. The detected fault may be, but not limited to, a short circuit, disconnection or damage of each heater. In particular, the methods may be obtained by simply sensing a voltage. As used herein, the heater refers to a heater constituting the battery heating system, and refers to a resistance heater, for example, a PTC planar heater, installed in each battery module to raise the temperature of the corresponding battery module. In the battery heating system, the resistance heaters may be connected in series to be connected to the battery pack as of a power source through the heater relay. Accordingly, as the on/off state of the heater relay is controlled, all the resistance heaters may be collectively on or off state (FIG. 3).

Figure 3:
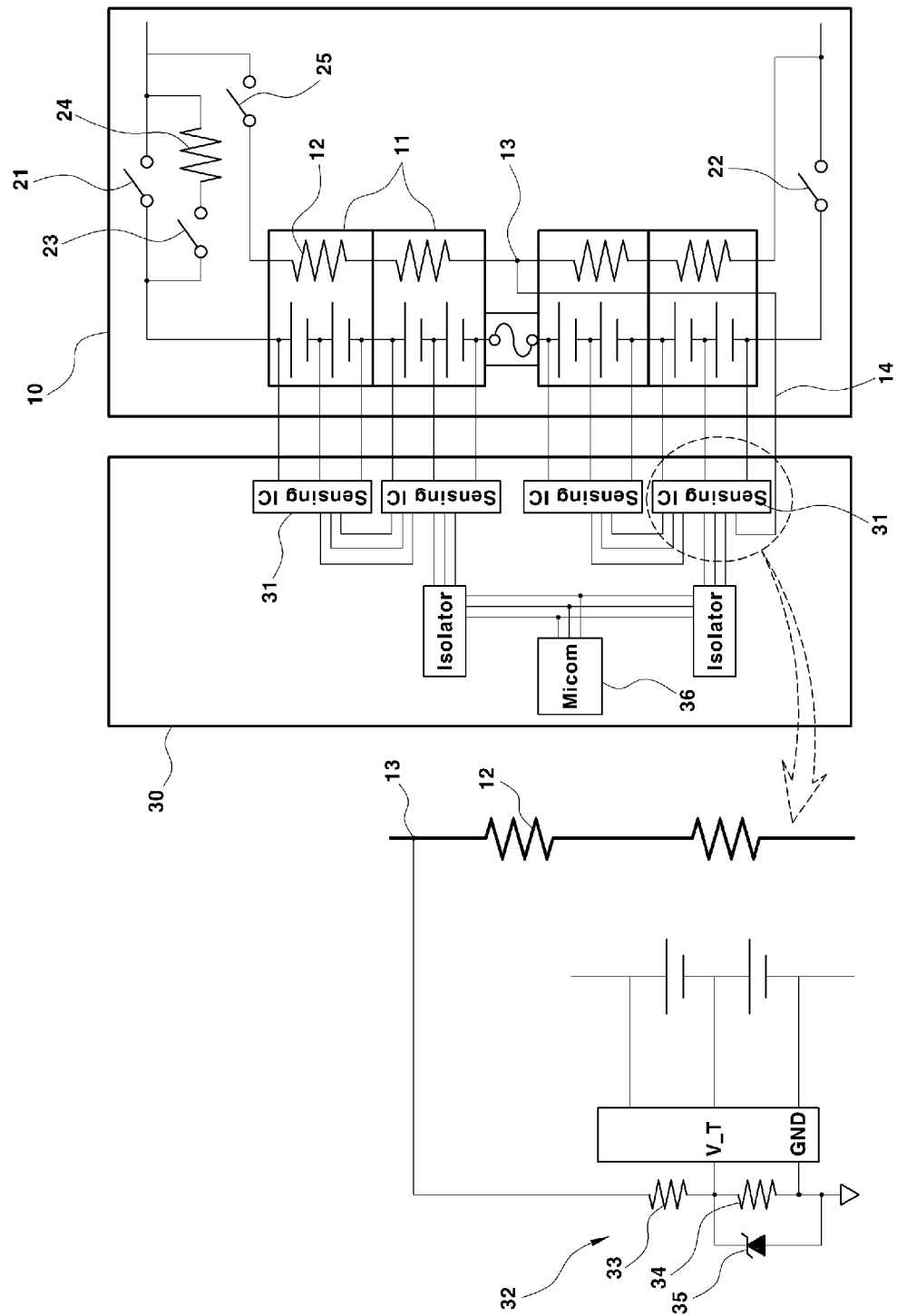
FIG. 3 shows an exemplary circuit diagram which includes an exemplary battery pack, an exemplary high voltage relays, an exemplary battery heating system, and an exemplary circuit configuration for detecting faults according to an exemplary embodiment of the present invention.
Figure 4:
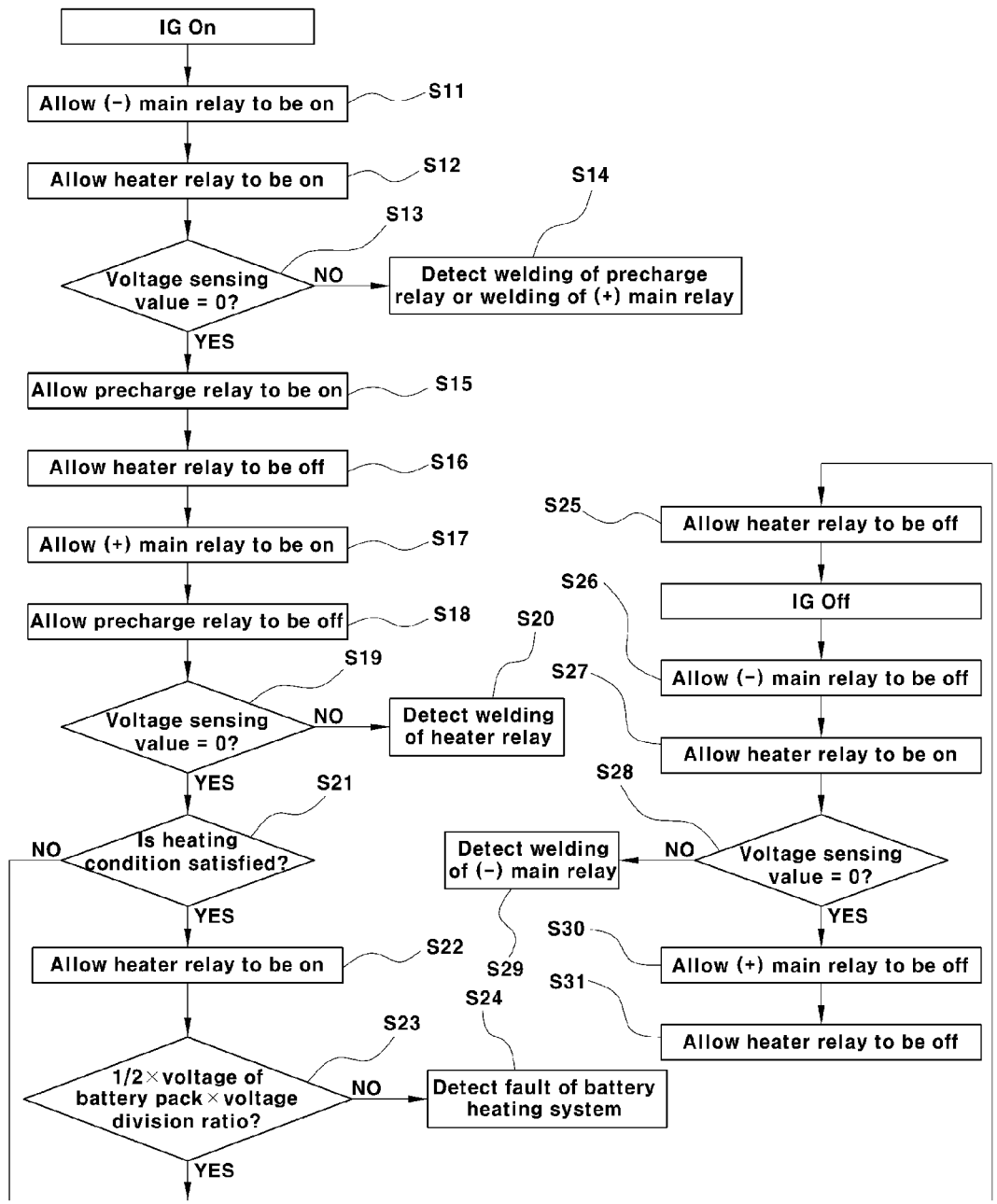
FIG. 4 illustrates an exemplary method for detecting a fault according to an exemplary embodiment of the present invention.
Figure 5:
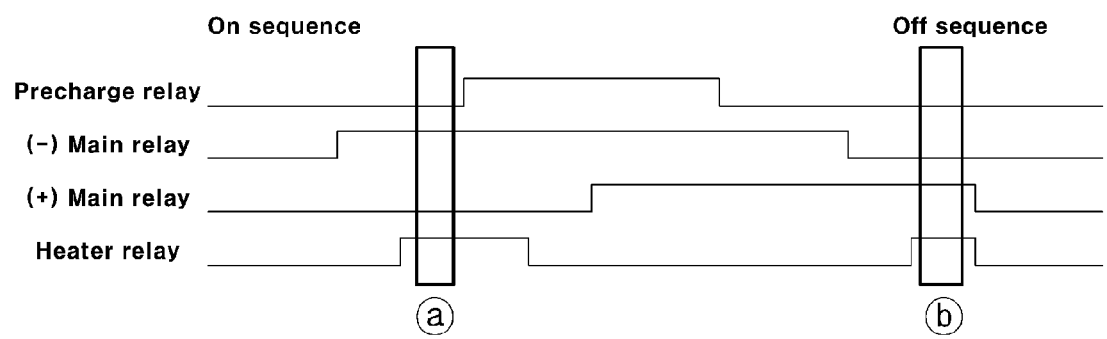
FIG. 5 illustrates exemplary on/off sequences of each relay to detect for welding of the relay according to an exemplary embodiment of the present invention.
Figure 6:
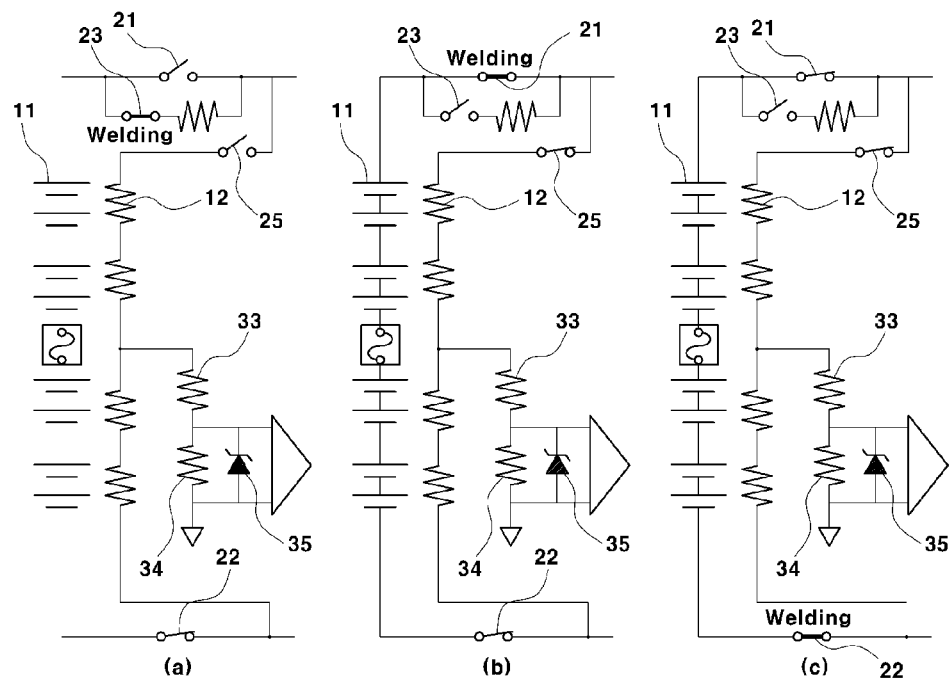
FIG. 6 illustrates that welding of each relay may be detected by identifying a voltage in a state in which the welding of the relay is made according to an exemplary embodiment of the present invention.
Figure 7:
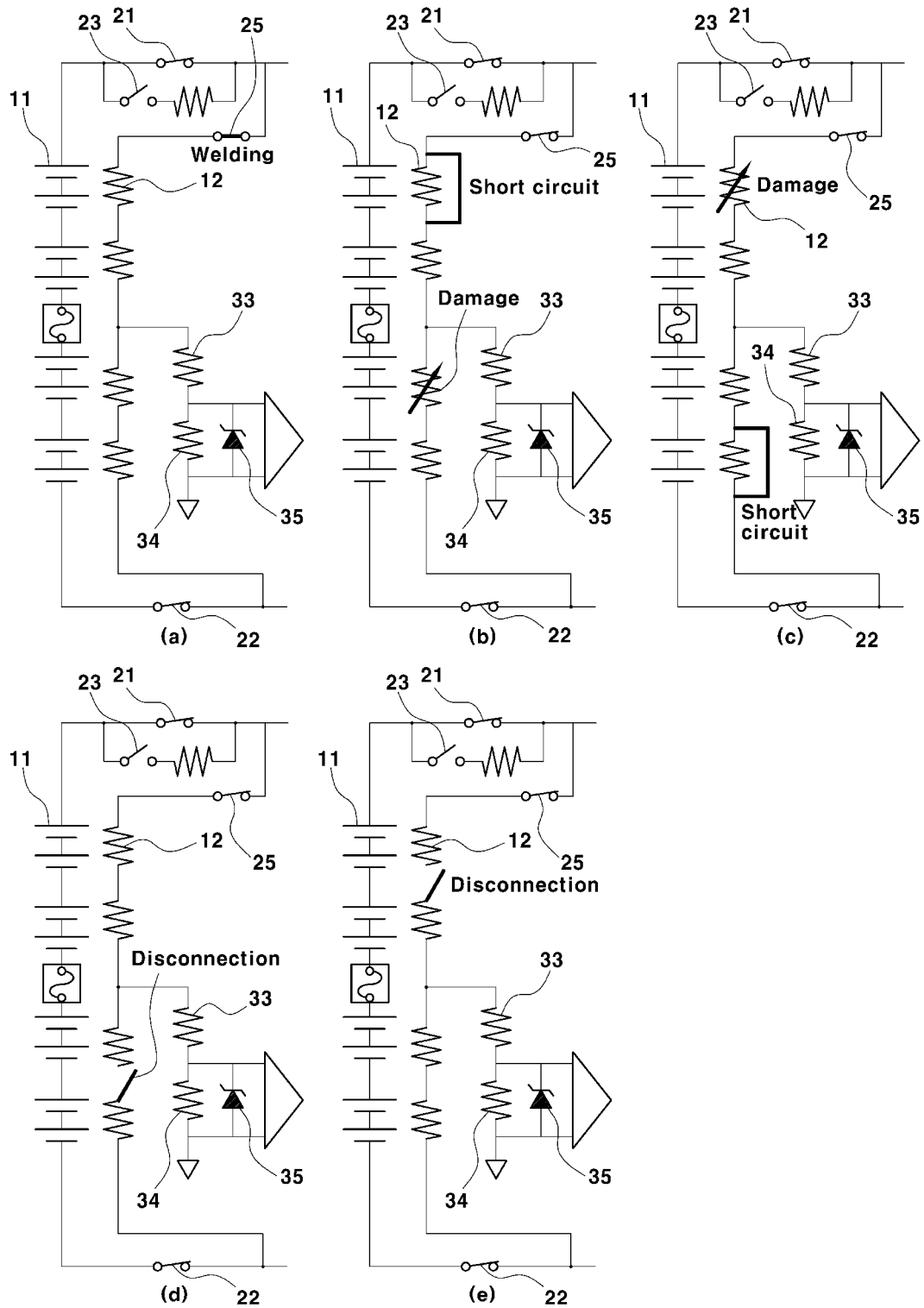
FIG. 7 illustrates an exemplary method for detecting a fault of the battery heating system depending on the kind of the fault according to an exemplary embodiment of the present invention.

FIG. 3 is an exemplary circuit diagram illustrating a battery pack, high voltage relays, a battery heating system, and a circuit configuration for detecting faults according to an exemplary embodiment of the present invention. FIG. 4 is a flowchart illustrating an exemplary method for detecting a fault according to an exemplary embodiment of the present invention. FIG. 5 illustrates exemplary on/off sequences of each relay to detect welding of the relay according to an exemplary embodiment of the present invention. FIG. 6 shows exemplary diagrams illustrating that welding of each relay may be detected by identifying a voltage when the welding of the relay is made. FIG. 7 shows an exemplary diagram illustrating an exemplary method for detecting a fault of the battery heating system depending on a type of the fault.

As shown in FIG. 3, a battery pack 10 may include a plurality of battery modules 11; a power relay assembly (PRA) including high voltage relays 21, 22 and 23 of (+) and (−) power lines connected to the battery pack 10; a heater relay 25 configured to open and close a heater power source; a heater 12 configured to increase or raise temperature and installed in each battery module 11; a battery voltage sensing circuit unit 31 configured to sense a voltage for each battery module or battery cell; a voltage sensing circuit unit 32 configured to detect fault and detect faults of the battery heating system and the relays; and a battery management system (BMS) 30 configured to operate the on/off state of the heater relay 25 and the high voltage relays 21, 22 and 23. In particular, a controller of BMS 30 may be configured to detect welding of the heater relay 25 and the high voltage relays 21, 22 and 23 from a voltage sensed by the voltage sensing circuit unit 32 of fault detection.

The PRA may include (+) and (−) main relays 21 and 22 respectively connected to the (+) and (−) power lines, and a precharge relay 23 and a precharge resistor 24, disposed on a circuit bypassing the (+) main relay 21. The battery voltage sensing circuit unit 31 may be configured to measure a voltage of each battery module 11 or a voltage of each battery cell. An example of the battery voltage sensing circuit unit 31 measuring a voltage of each battery cell is also illustrated in the circuit configuration of FIG. 3.

The voltage sensing circuit unit 32 for fault detection may be configured to branch a connection circuit for connecting between two adjacent heaters 12 connected in series at any one position 13 and may be configured to sense a voltage for fault detection through the branched circuit 14. In particular, in the battery heating system including a plurality of heaters 12 installed in the respective battery modules 11 connected in series, a voltage for fault detection may be sensed using the branch circuit 14 connected at the position 13 of the connection circuit having the same number of heaters at a front terminal thereof and the same number of heaters at a rear terminal thereof.

The voltage sensing circuit unit 32 for fault detection, as shown in FIGS. 6 and 7, may include a first resistor 33 and a second resistor 34 both of which are connected in series between the branch circuit 14 and a ground terminal on the branch circuit 14 and a zener diode 35 connected to both terminals of the second resistor 34 connected to the ground terminal. In particular, the voltage sensing circuit unit 32 may have a configuration such that a voltage applied to both the terminals of the second resistor 34 may be sensed as the voltage for fault detection.

As shown in FIG. 3, the voltage sensing circuit unit 32 requiring ground connection may be included in the battery voltage sensing circuit unit 31 at the most rear terminal, which may have a common ground terminal GND with the other battery voltage sensing circuit unit 31. In addition, a microcomputer (MICOM) 36 of the BMS 30 may be configured to recognize faults of the battery heating system and the relays and other faults from a signal transmitted via the battery voltage sensing circuit unit 31 at the most rear terminal via the voltage sensing circuit unit 32 for fault detection.

The method for detecting a fault will be described with reference to FIGS. 4 to 7. The detection of welding of the precharge relay 23 and the (+) main relay 21 may be performed by operating the BMS 30 to turn on the (−) main relay 22 and the heater relay 25 when the off state of the precharge relay 23 and the (+) main relay 21 is controlled, for example, when the off state of the precharge relay 23 and the (+) main relay 21 is controlled in an IG-ON process, and subsequently by sensing a voltage for fault detection using the voltage sensing circuit unit 32 for fault detection (FIGS. 6 (*a*) and (*b*)).

In addition, the detection of welding of the (−) main relay 22 may be performed by turning on the (+) main relay 21 and the heater relay 25 when the off state of the precharge relay 23 and the (−) main relay 22 is controlled, and subsequently by sensing a voltage for fault detection using the voltage sensing circuit unit 32 for fault detection (FIG. 6 (*c*)). For example, the voltage for fault detection may be sensed using the voltage sensing circuit unit 32 for fault detection by controlling the off state of the (−) main relay 22 when the precharge relay 23 is the off state in IG OFF, and by turning on the heater relay 25 while allowing the (+) main relay 21 to maintain an ON state.

Further, when the heater relay 25 has been in the on state previously by satisfying battery heating conditions, a voltage may be sensed by maintaining the ON state of the heater relay 25 in the IG OFF state to detect welding of the (−) main relay 22. The detection of welding of the heater relay 25 may be performed by sensing a voltage when both the (+) and (−) main relays 21 and 22 are in the on state or the precharge relay 23 is in an OFF state and when the off state of the heater relay 25 is controlled (FIG. 7 (*a*)).

As shown in FIGS. 4 and 5, in the IG-ON process, the (−) main relay 22 may be on after IG ON (S11), and then the heater relay 25 may be on (S12). Subsequently, a voltage may be sensed using the voltage sensing circuit unit 32 for fault detection. When the sensed voltage value is about 0 V, it may be determined that both the precharge relay 23 and the (+) main relay 21 are normal. Otherwise, it may be determined that any one of the precharge relay 23 and the (+) main relay 21 is in a welding state (S13 and S14).

When the value sensed using the voltage sensing circuit unit 32 for fault detection is the same as the following 1, it may be determined that the precharge relay 23 is in the welding state. When the value sensed through the voltage sensing circuit 32 for fault detection is the same as the following Equation 2, it may be determined that the (+) main relay 21 is in the welding state.

Sensing value=(voltage of battery pack or Σvoltages of battery cells)×((½×Σresistances of heaters)/(Σresistances of heaters+precharge resistance))× voltage division ratio of voltage sensing circuit for fault detection   Expression 1

Sensing value=(voltage of battery pack or Σvoltages of battery cells)×((½×Σresistances of heaters)/(Σresistances of heaters))×voltage division ratio of voltage sensing circuit for fault detection   Expression 2

In Expressions 1 and 2, the voltage of the battery pack is a voltage that may be obtained from a sensing value of the battery voltage sensing circuit unit 31. In Expressions 1 and 2, 'Σvoltages of battery cells' refers to a sum of voltages of all the battery cells which may be sensed by the battery voltage sensing circuit unit 31; 'Σresistances of heaters' refers to a sum of resistance values of all the heaters 12; and 'precharge resistance' refers to a resistance value of the precharge resistor 24. In addition, 'voltage division ratio' refers to a voltage distribution ratio by the first and second resistors 33 and 34 of the voltage sensing circuit unit 32 for fault detection, i.e., R2/(R1+R2). R1 and R2 are resistance values of the first and second resistors 33 and 34, respectively.

Configuration (a) in FIG. 6 shows an exemplary state in which the precharge relay 23 is welded, and configuration (b) in FIG. 6 shows an exemplary state in which the (+) main relay 21 is welded. The time point when the welding of the precharge relay 23 and the (+) main relay 21 is detected has been designated by ⓐ in FIG. 5. After the welding of the precharge relay 23 and the (+) main relay 21 is identified as described above, a typical IG-ON process may be performed. The precharge relay 23 may be in the on state when the (−) main relay 22 has been the on state previously (S15).

However, since the heater relay 25 has been previously on, the heater relay 25 may be in an off state (S16). Subsequently, since the (−) main relay 22 has been previously the on state, the (+) main relay 21 may be in the on state additionally (S17), and the precharge relay 23 may be then off (S18). Subsequently, the welding of the heater relay 25 may be detecting from a voltage sensed using the voltage sensing circuit unit 32 for fault detection when the on state of the (+) and (−) main relays 21 and 22 and the off state of the heater relay 25 are controlled (S19). When the voltage sensing value from the voltage sensing circuit unit 32 for fault detection is about 0 V, it may be determined that the heater relay 25 is normal. When the voltage sensing value is not 0 V, it may be determined that the heater relay 25 is in the welding state.

Configuration (a) of FIG. 7 shows a state in which the heater relay 25 is welded. Subsequently, a disconnection, short circuit or damage of the heater 12 when the resistance value of a corresponding heater is changed may be determined from a voltage value sensed using the voltage sensing circuit unit 32 for fault detection when the (+) and (−) main relays 21 and 22 are in the on states and when the heater relay 25 is in the on state.

For example, under a battery heating condition of less than a predetermined reference temperature after the IG-ON process, the heater relay 25 may be in the on state (S21 and S22). When the voltage value sensed using the voltage sensing circuit unit 32 for fault detection is '½×voltage of battery pack×voltage division ratio of voltage sensing circuit for fault detection', it may be determined that the battery heating system is normal. Otherwise, it may be determined that a fault of the battery heating system is detected (S24).

Particularly, when the voltage sensing value satisfies the condition of the following Expression 3, it may be determined as shown in (b) of FIG. 7 that a short circuit of the heater 12 positioned at the front end of the voltage sensing point or at branch point of the branch circuit for voltage sensing 13, or a damage or increase in resistance of the heater positioned at the rear end of the voltage sensing point 13 is detected. When the voltage sensing value satisfies the condition of the following Equation 4, it may be determined as shown in (c) of FIG. 7 that a short circuit of the heater 12 positioned at the rear end of the voltage sensing point 13, or a damage or increase in resistance of the heater positioned at the front end of the voltage sensing point is detected.

When the voltage sensing value satisfies the condition of the following Equation 5, it may be determined as shown in (d) of FIG. 7 that a disconnection of the heater 12 positioned at the rear end of the voltage sensing point 13 is detected. When the voltage sensing value satisfies the condition of the following Expression 6, it is determined as shown in (e) of FIG. 7 that a disconnection of the heater 12 positioned at the front end of the voltage sensing point 13 is detected.

Sensing value>½×voltage of battery pack×voltage division ratio of voltage sensing circuit unit for fault detection　　　　　Expression 3

Sensing value<½×voltage of battery pack×voltage division ratio of voltage sensing circuit unit for fault detection　　　　　Expression 4

Sensing value=zener voltage　　　　　Expression 5

Sensing value=0　　　　　Expression 6

As used herein, 'zener voltage' refers to a zener voltage or a breakdown voltage, for example, of about 5V, of the zener diode 35 in the voltage sensing circuit unit 32 for fault detection.

Accordingly, a fault of the battery heating system and the type of the fault may be determined from a voltage value sensed using the voltage sensing circuit unit 32. In addition, the position at which a short circuit, disconnection or damage of the heater 12 occurs may be estimated based on the voltage sensing point 13. Subsequently, the welding of the (−) main relay 22 may be detected from a voltage value sensed using the voltage sensing circuit unit 32 for fault detection after the off state of the (−) main relay 22 is controlled and the heater relay is the on state in a state in which the (+) main relay 21 is the on state.

For example, the off state of the (−) main relay 22 may be controlled in the IG-OFF process, and subsequently the heater relay 25 may be on, thereby detecting the welding of the (−) main relay 22 (S25, S26 and S27). When the sensing value of the voltage sensing circuit unit 32 for fault detection is about 0 V, it may be determined that the (−) main relay 22 is normal. Otherwise, it may be determined that welding of the (−) main relay 22 is detected (S28 and S29). In particular, the sensing value of the voltage sensing circuit unit 32 for fault detection may refer to the voltage value of Equation 2, and the welding state of the (−) main relay 22 is as shown in (c) of FIG. 6. The time point when the welding of the (−) main relay 22 is detected is shown as ⓑ in FIG. 5. When the process of detecting the welding of the (−) main relay 22 is finished as described above, the (+) main relay 21 and the heater relay 25 may be sequentially off as shown in FIG. 4 (S30 and S31).

As described above, according to various exemplary embodiments of the present invention, welding of each relay such as the main relay, the precharge relay or the heater relay may be detected. In addition, a fault of the battery heating system, a kind of fault such as short circuit, disconnection or damage of the heater, and a position of fault such as front or rear end based on the voltage sensing point may be determined, by simply sensing a voltage instead of sensing a temperature of an individual battery module or heater or an individual battery cell.

The invention has been described in detail with reference to exemplary embodiments thereof. However, it will be appreciated by those skilled in the art that changes may be made in these embodiments without departing from the principles and spirit of the invention, the scope of which is defined in the appended claims and their equivalents.

What is claimed is:

1. An apparatus for detecting faults of a heater relay and high voltage relays in a battery heating system which includes a heater installed in each battery module of a battery pack to heat the battery module, the heater relay configured to selectively apply power to the heaters connected in series, and the high voltage relays of (+) and (−) power lines connected to the battery pack, the apparatus comprising:
　　a voltage sensing circuit unit configured to detect a fault and configured to sense a voltage for fault detection when the faults of the heater relay and the high voltage relays are detected; and
　　a battery management system (BMS) configured to operate the on/off of the heater relay and the high voltage relays and detect welding of the heater relay and the high voltage relays from the voltage for fault detection,
　　wherein the BMS is configured to operate the off state of the heater relay when the (+) and (−) main relays among the high voltage relays are in the on state and when the precharge relay among the high voltage relays is in the off state, and then detect welding of the heater relay from the voltage for fault detection.

2. The apparatus of claim 1, wherein the voltage sensing circuit unit for fault detection is configured to sense a voltage for fault detection using a branch circuit branched from a connection circuit for connecting between two adjacent heaters connected in series.

3. The apparatus of claim 2, wherein, in the battery heating system including the heaters installed in the respective battery modules to be connected in series, the voltage sensing circuit unit for fault detection is connected to the branch circuit branched from the connection circuit having the same number of heaters at a front terminal thereof and the same number of heaters at a rear terminal thereof.

4. The apparatus of claim 2, wherein the voltage sensing circuit unit includes:
　　a first resistor and a second resistor connected in series between the branch circuit and a ground terminal on the branch circuit; and
　　a zener diode connected to both terminals of the second resistor,
　　wherein a voltage at both the terminals of the second resistor is sensed as the voltage for fault detection.

5. The apparatus of claim 1, wherein the BMS is configured to operate a (−) main relay and the heater relay to be in the on state when the off state of a precharge relay and a (+) main relay among the high voltage relays is controlled, and detect welding of the precharge relay and the (+) main relay from the voltage for fault detection.

6. The apparatus of claim 1, wherein the BMS is configured to operate the off state of the (−) main relay when the (+) main relay and the heater relay among the high voltage relays are in the on state and when the precharge relay among the high voltage relays is in the off state, and detect welding of the (−) main relay from the voltage for fault detection.

7. A method for detecting faults of a heater relay and high voltage relays in a battery heating system which includes a heater installed in each battery module of a battery pack to heat the battery module, the heater relay configured to selectively apply power to the heaters connected in series, and the high voltage relays of (+) and (−) power lines connected to the battery pack, the method comprising:
operating, by a controller, an on/off state of the heater relay and the high voltage relays through a predetermined process to detect a fault of the heater relay or the high voltage relay; and
detecting, by the controller, welding of the heater relay or the high voltage relay from a voltage for fault detection which is sensed using a voltage sensing circuit unit for fault detection,
wherein the off state of the heater relay is controlled when which the (+) and (−) main relays among the high voltage relays are in the on state and when the precharge relay among the high voltage relays is in the off state, and welding of the heater relay is then decided from the voltage for fault detection.

8. The method of claim 7, wherein the voltage sensing circuit unit for fault detection is configured to sense a voltage for fault detection using a branch circuit branched from a connection circuit for connecting between two adjacent heaters connected in series.

9. The method of claim 8, wherein, in the battery heating system including the heaters installed in the respective battery modules to be connected in series, the voltage sensing circuit unit for fault detection is connected to the branch circuit branched from the connection circuit having the same number of heaters at a front terminal thereof and the same number of heaters at a rear terminal thereof.

10. The method of claim 8, wherein the voltage sensing circuit unit includes:
a first resistor and a second resistor connected in series between the branch circuit and a ground terminal on the branch circuit; and
a zener diode connected to both terminals of the second resistor,
wherein a voltage at both the terminals of the second resistor is sensed as the voltage for fault detection.

11. The method of claim 10, wherein the detection that welding of the precharge relay is detected when the voltage for fault detection is determined using Expression 1, and the detection that welding of the (+) main relay is detected when the voltage for fault detection is determined using Expression 2;

$$\text{Sensing value} = (\text{voltage of battery pack or } \Sigma\text{voltages of battery cells}) \times ((\tfrac{1}{2} \times \Sigma\text{resistances of heaters})/(\Sigma\text{resistances of heaters} + \text{precharge resistance})) \times \text{voltage division ratio of voltage sensing circuit for fault detection} \qquad \text{Expression 1}$$

$$\text{Sensing value} = (\text{voltage of battery pack or } \Sigma\text{voltages of battery cells}) \times ((\tfrac{1}{2} \times \Sigma\text{resistances of heaters})/(\Sigma\text{resistances of heaters})) \times \text{voltage division ratio of voltage sensing circuit for fault detection,} \qquad \text{Expression 2}$$

wherein the voltage of the battery pack or 'Σvoltages of battery cells' is obtained from a sensing value of a battery voltage sensing circuit unit; 'Σresistances of heaters' is a sum of resistance values of all the heaters; the precharge resistance is the resistance value of a precharge resistor of a power relay assembly (PRA); and the voltage division ratio is a voltage distribution ratio by the first and second resistors,
wherein the voltage sensing circuit unit for fault detection senses a voltage for fault detection through the branch circuit branched from the connection circuit for connecting between the two adjacent heaters connected in series, and
wherein the voltage sensing circuit unit for fault detection is connected to the branch circuit branched from the connection circuit having the same number of heaters at a front terminal thereof and the same number of heaters at a rear terminal thereof.

12. The method of claim 10, wherein, when the voltage for fault detection is about '½×voltage of battery pack× voltage division ratio of voltage sensing circuit unit for fault detection' when the (+) and (−) main relays are in the on state and when the heater relay is the on state, the heater is determined to be normal, and
wherein the voltage of the battery pack is obtained from a sensing value of the battery voltage sensing circuit unit, the voltage division ratio is a voltage distribution ratio by the first and second resistors, and the voltage sensing circuit unit for fault detection is configured to sense a voltage for fault detection using the branch circuit branched from the connection circuit for connecting between the two adjacent heaters connected in series and is connected to the branch circuit branched from the connection circuit having the same number of heaters at a front terminal thereof and the same number of heaters at a rear terminal thereof.

13. The method of claim 12, wherein, when the voltage for fault detection satisfies the condition of Expression 3, a short circuit is determined of the heater positioned at the front end of a branch point at which the branch circuit is branched or a damage of the heater positioned at the rear end of the branch point is detected,
wherein, when the voltage for fault detection satisfies the condition of Expression 4, a short circuit is determined of the heater positioned at the rear end of the branch point or a damage of the heater positioned at the front end of the branch point is detected,
wherein, when the voltage for fault detection satisfies the condition of Expression 5, a disconnection is determined of the heater positioned at the rear end of the branch point is detected,
wherein, when the voltage for fault detection satisfies the condition of Expression 6, a disconnection is determined of the heater positioned at the front end of the branch point is detected;

$$\text{Sensing value} > \tfrac{1}{2} \times \text{voltage of battery pack} \times \text{voltage division ratio of voltage sensing circuit unit for fault detection} \qquad \text{Expression 3}$$

$$\text{Sensing value} < \tfrac{1}{2} \times \text{voltage of battery pack} \times \text{voltage division ratio of voltage sensing circuit unit for fault detection} \qquad \text{Expression 4}$$

Sensing value=zener voltage    Expression 5

Sensing value=0, and    Expression 6 wherein the zener voltage is a zener voltage of the zener diode in the voltage sensing circuit unit for fault detection.

14. The method of claim 7, wherein a (−) main relay and the heater relay are in the on states when the off state of a precharge relay and a (+) main relay among the high voltage relays is controlled, and welding of the precharge relay and the (+) main relay is detected from the voltage for fault detection.

15. The method of claim 14, further comprising:
determining, by the controller, that both the precharge relay and the (+) main relay are normal when the voltage for fault detection is about 0 V; and
determining, by the controller, that any one of the precharge relay and the (+) main relay is in a welding state when the voltage for fault detection is greater than about 0 V.

16. The method of claim 7, wherein the off state of the (−) main relay is controlled, when the (+) main relay and the heater relay among the high voltage relays are in the on state and when the precharge relay among the high voltage relays is in the off state, and welding of the (−) main relay is detected from the voltage for fault detection.

17. The method of claim 16, further comprising:
determining, by the controller, that the (−) main relay is normal when the voltage for fault detection is about 0 V; and
determining, by the controller, that the (−) main relay is in the welding state when the voltage for fault detection is greater than about 0 V.

18. The method of claim 7, further comprising:
determining, by the controller, that the heater relay is normal when the voltage for fault detection is about 0 V; and
determining, by the controller, that the heater relay is in the welding state when the voltage for fault detection is greater than 0 V.

* * * * *